United States Patent
In et al.

(10) Patent No.: US 10,539,817 B2
(45) Date of Patent: Jan. 21, 2020

(54) DISPLAY DEVICE

(71) Applicant: SAMSUNG ELECTRONICS CO., LTD., Suwon-si (KR)

(72) Inventors: Woo Sung In, Hwaseong-si (KR); Doo Soon Park, Yongin-si (KR); Woong Hee Lee, Suwon-si (KR); Jeong Roh Lee, Hwaseong-si (KR); Sung Soo Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 276 days.

(21) Appl. No.: 15/187,184

(22) Filed: Jun. 20, 2016

(65) Prior Publication Data

US 2016/0291392 A1 Oct. 6, 2016

Related U.S. Application Data

(63) Continuation of application No. 13/731,260, filed on Dec. 31, 2012, now Pat. No. 9,398,711.

(30) Foreign Application Priority Data

Dec. 30, 2011 (KR) .................. 10-2011-0147728

(51) Int. Cl.
*G06F 1/16* (2006.01)
*H05K 5/00* (2006.01)
(Continued)

(52) U.S. Cl.
CPC .. *G02F 1/133308* (2013.01); *G02F 1/133512* (2013.01); *G02F 1/133528* (2013.01);
(Continued)

(58) Field of Classification Search
CPC .. H05K 7/14; H05K 7/16; H05K 7/17; H05K 7/1427; H05K 7/00; H05K 5/0017;
(Continued)

(56) References Cited

U.S. PATENT DOCUMENTS 5,666,261 A * 9/1997 Aguilera ............... B32B 3/12
361/679.09
6,532,152 B1   3/2003 White et al.
(Continued)

FOREIGN PATENT DOCUMENTS

EP    2 012 0295 A1   1/2009
JP    2005-079457 A   3/2005
(Continued)

OTHER PUBLICATIONS

Communication issued by the European Patent Office dated Sep. 29, 2017 in counterpart European Patent Application No. 12199494.1.
(Continued)

*Primary Examiner* — Anthony M Haughton
(74) *Attorney, Agent, or Firm* — Sughrue Mion, PLLC

(57) ABSTRACT

A display device including a display panel, a rear cover, disposed at a rear of the display panel, which forms a rear exterior of the display panel, and a reinforcing member disposed between the display panel and the rear cover, such that the strength of the display device is increased, wherein the reinforcing member includes a body unit having a shape of the display panel and forms an external appearance of the reinforcing member, and a plurality of cells that penetrate the body unit.

17 Claims, 9 Drawing Sheets

(51) Int. Cl.
*H05K 7/00* (2006.01)
*G02F 1/1333* (2006.01)
*G02F 1/1335* (2006.01)
*H05K 5/03* (2006.01)
*H05K 7/14* (2006.01)

(52) U.S. Cl.
CPC ............ *H05K 5/0017* (2013.01); *H05K 5/03* (2013.01); *H05K 7/00* (2013.01); *H05K 7/1427* (2013.01); *G02F 2001/13332* (2013.01); *G02F 2001/133314* (2013.01); *G02F 2001/133317* (2013.01); *G02F 2001/133331* (2013.01); *G02F 2201/503* (2013.01)

(58) Field of Classification Search
CPC ............... H05K 5/03; G02F 1/133308; G02F 1/133512; G02F 1/133528
USPC .............. 361/679.21–679.3, 679.55, 679.56, 361/679.01, 679.02
See application file for complete search history.

(56) References Cited

U.S. PATENT DOCUMENTS

| | | | |
|---|---|---|---|
| 6,611,302 B1 | 8/2003 | Ueda et al. | |
| 6,847,415 B1 | 1/2005 | Yoshimura et al. | |
| 6,853,409 B2 | 2/2005 | Takeishi | |
| 7,310,222 B2 | 12/2007 | Bovio et al. | |
| 7,580,250 B2* | 8/2009 | Shin | G02B 6/0088 349/58 |
| 7,582,250 B2* | 9/2009 | Uchida | B29C 45/174 264/328.13 |
| 2009/0207334 A1 | 8/2009 | Kim et al. | |
| 2012/0327325 A1* | 12/2012 | Park | G06F 1/1637 349/58 |
| 2013/0128445 A1* | 5/2013 | Cheng | G06F 1/1637 361/679.26 |

FOREIGN PATENT DOCUMENTS

| | | |
|---|---|---|
| JP | 3991656 A | 10/2007 |
| JP | 2008-276035 A | 11/2008 |
| JP | 2009-147127 A | 7/2009 |
| JP | 2009-294698 A | 12/2009 |
| KR | 10-2007-0057308 A | 6/2007 |
| KR | 10-2011-0107630 A | 10/2011 |
| KR | 10-2011-0139039 A | 12/2011 |

OTHER PUBLICATIONS

Communication dated Jul. 10, 2017, issued by the State Intellectual Property Office of P.R. China in counterpart Chinese Patent Application No. 201210599277.1.
Communication dated Nov. 8, 2016 issued by the European Patent Office in counterpart European Patent Application No. 16183012.0.
Communication dated Dec. 6, 2016 issued by the State Intellectual Property Office of P.R. China in counterpart Chinese Patent Application No. 201210599277.1
Communication dated Feb. 11, 2013 issued by the European Patent Office in counterpart European Patent Application No. 121999494.1.
Communication dated Mar. 6, 2019 issued by the European Intellectual Property Office in counterpart European Application No. 16 183 012.0.
Communication dated Apr. 24, 2019 issued by the Korean Intellectual Property Office in counterpart Korean Application No. 10-2019-0011849.
Communication dated Apr. 19, 2018, issued by the Korean Patent Office in counterpart Korean Application No. 10-2011-0147728.
Communication dated Oct. 30, 2018, issued by the Korean Intellectual Property Office in corresponding Korean Application No. 10-2011-0147728.
Communication dated Oct. 25, 2019, issued by the Korean Patent Office in counterpart Korean Application No. 10-2019-0011849.

* cited by examiner

DISPLAY DEVICE

CROSS-REFERENCE TO RELATED APPLICATION

This is a Continuation of U.S. application Ser. No. 13/731,260 filed Dec. 31, 2012, which claims the benefit of Korean Patent Application No. 2011-0147728, filed on Dec. 30, 2011 in the Korean Intellectual Property Office, the disclosure of which is incorporated herein by reference.

BACKGROUND

1. Field

Embodiments of the present disclosure relate to a display device. More particularly, embodiments relate to a display device having an increased strength.

2. Description of the Related Art

In the related art, to achieve a slimmer profile, a lighter weight, and low power consumption, a flat panel display device replaces a cathode-ray tube display device.

A related art flat display device may be divided into a light emitting type and a light receiving type. In the light emitting type, a Plasma Display Panel (PDP), a Light Emitting Diode (LED), and an Organic Light Emitting Diode (OLED) are included. In the light receiving type, a Liquid Crystal Display (LCD) is included.

Although a related art flat panel display device may have a slimmer profile and a lighter weight with respect to the display device, research has increased to also increase the strength of the display device.

SUMMARY

Therefore, the present disclosure provides a display device having a reinforcing member. The reinforcing member, which is configured to increase the overall strength of the display device while the weight of the display device is not largely increased, is inserted into an inside of the display device.

Additional aspects of the disclosure will be set forth in the description which follows. Therefore, aspects of the disclosure will be obvious from the description, or may be apparent by practice of the disclosure.

In accordance with one aspect of the represent disclosure, a display device configured to display an image includes a display panel, a rear cover, and a reinforcing member. The rear cover may be disposed at a rear of the display panel to form a rear exterior of the display panel. The reinforcing member may be disposed between the display panel and the rear cover, such that the strength of the display device is increased. The reinforcing member may include a body unit, having a shape of the display panel and configured to form an external appearance of the reinforcing member, and a plurality of cells formed to penetrate the body unit.

The reinforcing member may be formed with a honeycomb structure.

Each of the plurality of cells may be provided in a shape of a hexagon.

Each of the plurality of the cells may be formed in at least one of a triangular shape, a rectangular shape, and a circular shape.

The display device may further include at least one plate coupled to at least one of a front surface and a rear surface of the reinforcing member, such that the at least one plate is coupled to the reinforcing member.

The reinforcing member and the at least one plate may be adhesively coupled to each other by an adhesive member.

The reinforcing member and the rear cover may be adhesively coupled to each other by an adhesive member.

The reinforcing member and the display panel may be adhesively coupled to each other by an adhesive member.

The adhesive member may include at least one of a double-sided tape and an adhesive.

The display device may further include a main frame configured to cover an edge of a side surface of the display panel and the rear cover.

The display panel and the rear cover are mounted on the main frame

The display device may further include at least one backlight unit configured to provide light to the display panel, and a bottom sash mounted on the backlight unit and disposed in between the display panel and the rear cover.

The reinforcing member may be mounted at a front surface of the bottom sash.

The reinforcing member may be mounted at a rear surface of the bottom sash.

The reinforcing member may be integrally formed with the bottom sash.

In accordance with another aspect of the present disclosure, a display device includes a display panel, a rear cover, and a honeycomb member. The rear cover may be disposed at a rear of the display panel to form a rear exterior of the display panel. The honeycomb member may be disposed in between the display panel and the rear cover.

The honeycomb member may be adhesively coupled to at least one of the display panel and the rear cover by an adhesive member.

The adhesive member may include at least one of a double-sided tape and an adhesive.

The display device may further include at least one plate coupled to at least one of a front surface and a rear surface of the honeycomb member.

In accordance with another aspect of the present disclosure, a display device includes a display panel, a plurality of light emitting diodes configured to provide light to the display panel, at least one printed circuit board in which the plurality of light emitting diodes are mounted, a bottom sash in which the at least one printed circuit board is mounted, and a honeycomb member mounted on the bottom sash.

In accordance with another aspect of the present disclosure, a display device includes a display panel, a plurality of light emitting diodes configured to provide light to the display panel, at least one printed circuit board in which the plurality of light emitting diodes are installed, and a bottom sash in which the at least one printed circuit board is mounted. The bottom sash may be formed with a honeycomb structure.

In accordance with a further aspect of the present disclosure, a display device may include a display panel formed on a top sash and a bottom sash; a front cover disposed at a front surface of the display panel; a rear cover, disposed at a rear surface of the display panel to form an exterior appearance of the display device by coupling the rear cover to the front cover; and a reinforcing member disposed at the rear surface of the display panel.

By inserting a reinforcing member into an inside a display device, the strength of the display device may be increased.

The reinforcing member is formed in a way that a plurality of cells penetrate the surface of the reinforcing member, the weight thereof is not heavy, and thus even in a case when the reinforcing member is inserted, and weight of the display device is not largely increased.

BRIEF DESCRIPTION OF THE DRAWINGS

These and/or other aspects of the disclosure will become apparent and more readily appreciated from the following description of the embodiments, taken in conjunction with the accompanying drawings of which.

DETAILED DESCRIPTION

Figure 1:
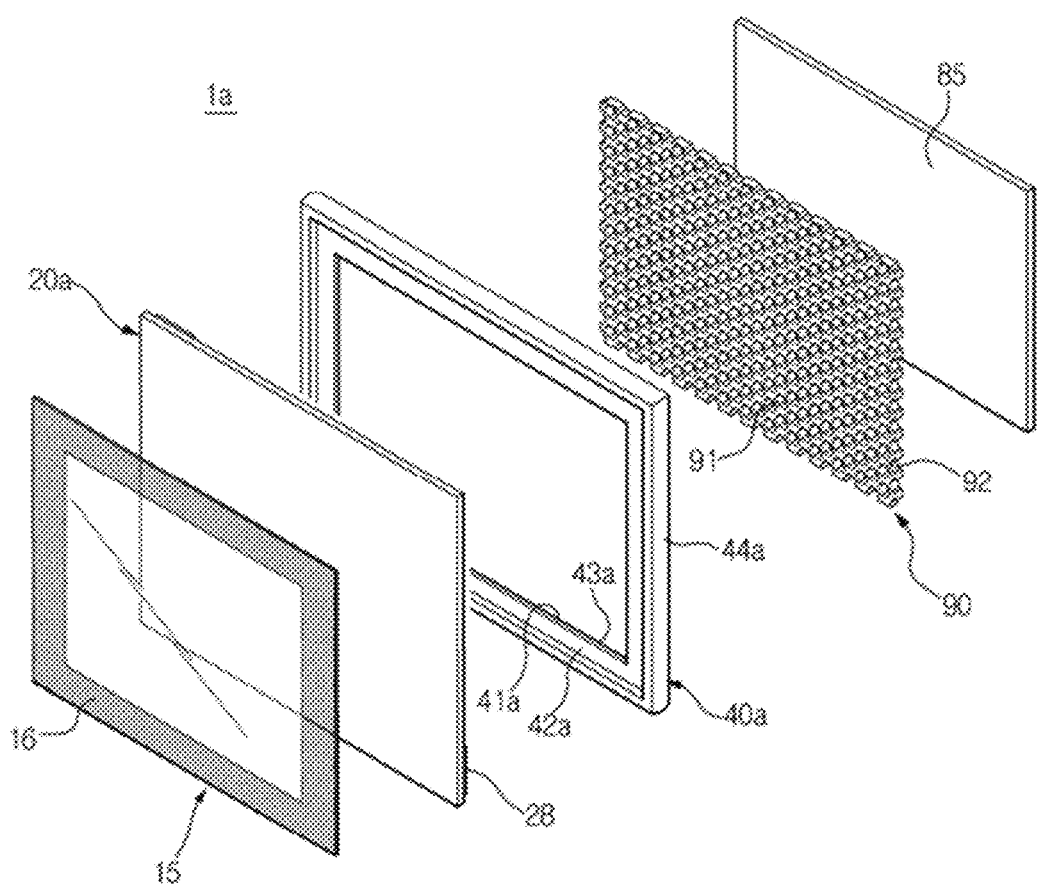
FIG. 1 is a perspective view illustrating a structure of a display device in accordance with the first embodiment of the present disclosure.

Reference will now be made in detail to the embodiments of the present disclosure, examples of which are illustrated in the accompanying drawings, wherein like reference numerals refer to like elements throughout.

FIG. 1 is a perspective view illustrating a structure of a display device in accordance with the first embodiment of the present disclosure.

As illustrated in FIG. 1, a display device 1a includes a display panel 20a, a main frame 40a wrapping around the edge of the side surface of the display panel 20a, a rear cover 85 forming the rear exterior appearance of the display device 1a, and a film 15 attached to the front surface of the display panel 20a.

In the embodiment, the display panel 20a is referred to as an organic light emitting diode panel.

The display panel 20a is divided into an active area, in which an image is displayed, and an inactive area, in which an image is not displayed.

A plurality of thin film transistors is mounted at the organic light emitting diode to drive a glass board. An anode electrode is configured to form a pixel, a cathode electrode is configured as a reference voltage, and a light emitting layer, composed of an organic material, is formed on the thin film transistor.

The light emitting layer is aligned in a plurality of cell units. When the light emitting layer, composed of individual cells, controls the radiated light, an image is formed on the active area.

However, a driving electrode pattern is formed on the inactive area of the organic light emitting diode panel to drive each of the thin film transistors. A printed circuit board is electrically connected to supply data and power to the driving electrode pattern.

With respect to the present disclosure, to display an image on the active area of the display panel 20a along the edge of the front surface of the display panel 20a, an integrated circuit or a wiring pattern is disposed at the inactive area to apply a signal to the display panel 20a.

In the present disclosure, the integrated circuit or the wiring pattern is defined together as a pattern.

To cover the pattern of the display panel 20a, a black matrix unit 16 is formed on the film 15 attached to the front surface of the display panel 20a.

The black matrix unit 16 may be formed by printing either the front surface or the rear surface of the film 15, or the black matrix unit 16 may be formed by printing the in-between of each layer included in the film 15. Other than the printing, a method to cover the pattern of the display panel 20a by treating a portion of the film black may be included in an aspect of the present disclosure.

Figure 2:
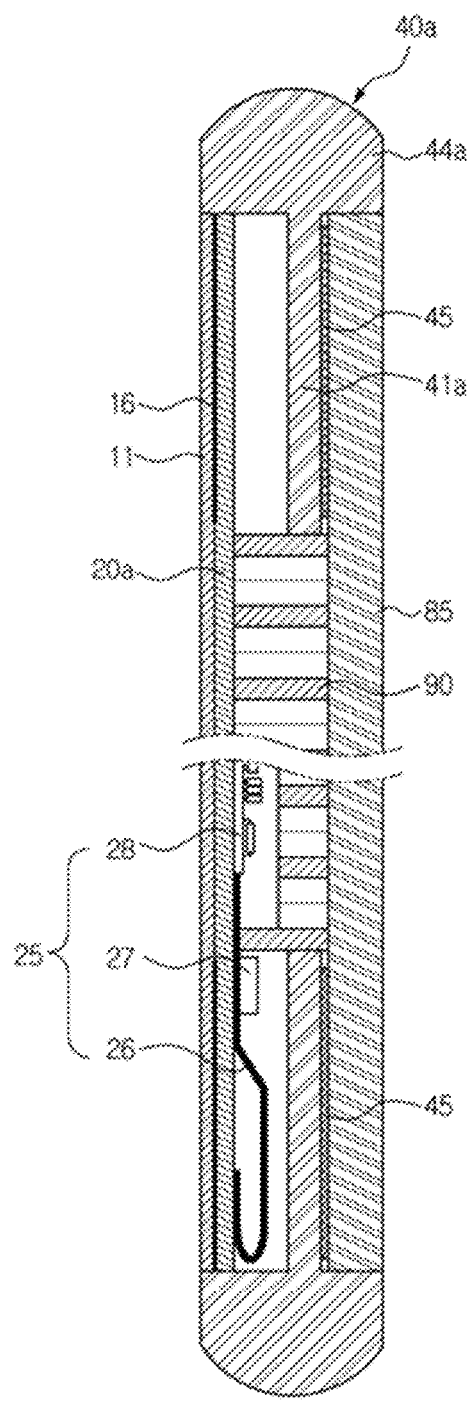
FIG. 2 is a cross-sectional view of the display device of FIG. 1.

By referring to FIG. 2, in the embodiments, the black matrix 16 is formed on the rear surface of the film 15.

The film 15 may be provided with a polarizing function, while performing a role to protect the display panel 20a.

The film 15 may include a PVA layer configured to polarize the penetrated light, a TAC layer configured to protect the PVA layer at the upper side of the PVA layer, and a COP layer. A viscosity layer is formed at the lowest layer of the film 15 to attach the film 15 to the display panel 20a.

The TAC layer is configured to protect the PVA layer, and may be formed with s tri-acetyl cellulose (TAC) having a phase value of about '0'.

The PVA layer is the layer configured to determine the characteristic of the polarity, and is composed of by orienting iodine I or a poly-vinyl alcohol (PVA) with a dye.

The COP layer (120c) is composed by orienting a COP (cyclo-olefin polymer) film.

A rear cover 85 is settled at the settling unit 41a, and forms the exterior appearance of the rear of the display device 1a.

The rear cover 85 may be formed with plastic or metallic material. The rear cover 85 may be formed with tempered glass.

The rear cover 85 is coupled with a reinforcing member 90.

The reinforcing member 90 includes a body unit 92, and a plurality of cells 91 penetratively formed through the body unit 92. The cell 91 is provided with a shape of a hollow hole on the body unit 92.

The reinforcing member 90, as shown in FIG. 1, may include the body unit 92, and the plurality of cells 91 penetratively formed through the body unit 92. The cell 91 may be provided with a shape of a hollow hole on the body unit 92.

Figure 1A:
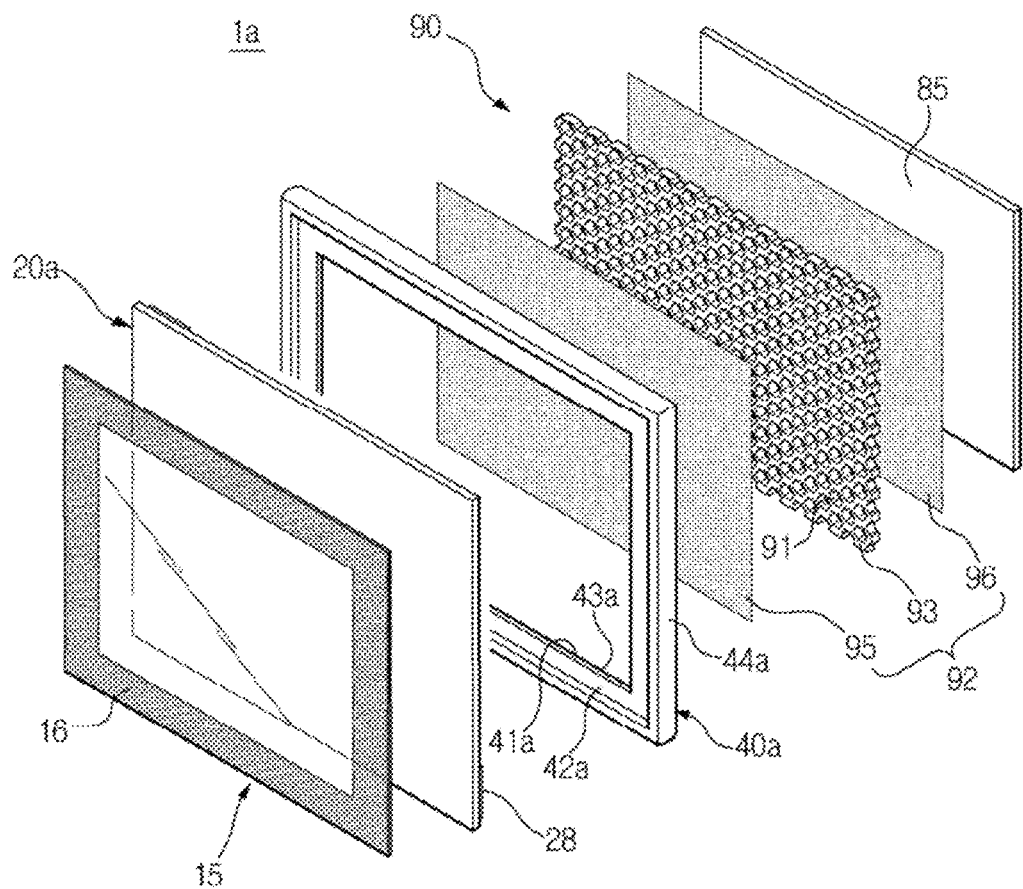
FIG. 1A is a perspective view illustrating another example of a reinforcing member shown in FIG. 1.

In addition, the reinforcing member, as shown in FIG. 1A, may include the body unit 92, including two plates 95 and 96 and a support 93 disposed between the two plates 95 and 96, and the plurality of cells 91 penetratively formed through the body unit 92. The cell 91 may be provided with a shape of a hollow hole on the body unit 92.

In the above case where the body unit 92 includes the two plates 95 and 96 and the support 93, the body unit 92 may be referred to as a plate-like assembly.

Although each of the two plates 95 and 96 and the support 93 is illustrated as an integral unit on the drawings, the present disclosure is not limited thereto. For example, each of the two plates 95 and 96 and the support 93 may be provided as a plurality of subdivided units, so as to be coupled to one another. In the case where each of the two plates 95 and 96 and the support 93 is provided as a plurality of subdivided units, some of the plurality of subdivided units may be coupled to the rear cover 85.

The two plates 95 and 96 each may be provided in the form of a sheet, and an example of the sheet may include an aluminum sheet or an non-woven fabric. However, the form of the plates 95 and 96 of the present disclosure is not limited thereto.

In the embodiment, the cell 91 is formed in a hexagonal shape. The structure having a plurality of hexagonal cells is referred to as a honeycomb structure or a beehive structure.

Honeycomb structures are natural or man-made structures that have the geometry of a honeycomb to allow the minimization of the amount of used material to reach minimal weight and minimal material cost and the strength is high.

The geometry of honeycomb structures can vary widely but the common feature of all such structures is an array of hollow cells formed between thin vertical walls.

The cells are often columnar and hexagonal in shape.

A honeycomb shaped structure provides a material with minimal density and relative high out-of-plane compression properties and out-of-plane shear properties.

Man-made honeycomb structural materials are commonly made by layering a honeycomb material between two thin layers that provide strength in tension.

This forms a plate-like assembly.

Honeycomb materials are widely used where flat or slightly curved surfaces are needed and their high strength-to-weight ratio is valuable.

They are widely used in the aerospace industry for this reason, and honeycomb materials in aluminum, fibreglass and advanced composite materials have been featured in aircraft and rockets since the 1950s.

They can also be found in many other fields, from packaging materials in the form of paper-based honeycomb cardboard, to sporting goods like skis and snowboards.

The reinforcing member 90 is formed in the honeycomb structure, and thus is light and strong.

As the reinforcing member 90 is mounted at the rear cover 85, the strength of the rear cover 85 may be increased. Thus, as the strength of the rear cover 85 is increased, the durability of the entire display device 1a is also increased.

In a case when the rear cover 85 is formed in a flat panel type, the reinforcing member 90 may be mounted to supplement any insufficient strength.

The weight of the reinforcing member 90, having the honeycomb structure, is not large. Thus, the weight of the entire display device 1a is not increased by a large amount. Therefore, the entire display device 1a corresponds to the recent trend of lighter weight.

In a case of the body unit 92, formed by using the material having high heat conductivity, the body unit 92 is provided with a heat radiation function. The display panel 20a is sensitive to heat. In a case that heat is concentrated in a particular portion, the function of the display panel 20a may be decreased. Thus, the heat being generated from a main board (not shown) and a power supply board (not shown) needs to be dispersed entirely throughout the display panel 20a, or to the display device 1a. In a case when the body unit 92 of the reinforcing member 90 is formed with the material having high heat conductivity, the heat being generated from a particular portion of the display device 1a may be dispersed entirely throughout the display device 1a.

When the body unit 92 is formed with aluminum, the reinforcing member 90 having a sufficient strength and an insulation function may be obtained. However, to insulate the reinforcing member 90 and the other components, the seat formed with heat radiation material may be attached to at least one side among the both sides of the reinforcing member 90.

The body unit 92 may be formed with plastic material. The plastic material is very light. The reinforcing member 90, formed with plastic material, is sufficient enough to reinforce the strength of the display device 1a. Furthermore, the reinforcing member 90 may be provided with a heat radiation function. The reinforcing member 90 performs an insulation function.

Some of the materials of the body unit 92 of the reinforcing member 90 are listed above. However, the body unit 92, formed with various materials, that can achieve the objective of the present disclosure may be included in the aspect of the present disclosure.

In the embodiment, to achieve the honeycomb structure, the cell 91 is formed in a hexagonal shape. The cell 91, formed in a circular shape or in a polygonal shape, may be included in the present disclosure.

The main frame 40a includes an edge unit 44a and a settling unit 41a, extendedly formed while protruded toward an inner side.

The front surface of the settling unit 41a forms a panel settling surface 42a at which the display panel 20a is settled, and the rear surface of the settling unit 41a forms a rear cover settling surface 43a at which the rear cover 85 is settled.

When the display panel 20a and the rear cover 85 are settled at the settling unit 41a, the edge unit 34 covers the edge surface of the side surface of the display panel 20a and the edge surface of the side surface of the rear cover 85. [91] The rear cover 85 and the reinforcing member 90, coupled to the rear cover 85, are settled at the rear cover settling surface 43a formed at the rear surface of the settling unit 41a of the main frame. The rear cover 85 makes contact and is coupled to the rear cover settling surface 43a.

FIG. 2 is a cross-sectional view of the display device of FIG. 1.

As illustrated in FIG. 2, the main frame 40a includes the edge unit 44a, and the settling unit 41a extendedly formed while protruded toward an inner side. The rear cover settling surface 43a, at which the rear cover 85 is settled, is formed at the rear surface of the settling unit 41a. An edge portion of the rear cover 85 is attached to the rear cover settling surface 43a by use of adhesive member 45.

The adhesive member 45 refers to a double-sided tape. Other than the double-sided tape, any member capable of attaching and coupling the rear cover settling surface 43a to the rear cover 85 by using adhesiveness, e.g., an adhesive may be included in the aspect of the present disclosure.

A flexible printed circuit board 26 is mounted at the rear of the display panel 20a.

The flexible printed circuit board 26 may be provided with a form of a Tape Carrier Package (TCP) using Tape Automated Bonding (TAB) technology, or a Chip-on-Film (COF) provided with a chip device mounted at a base film.

The TCP, on the flexible printed circuit board 26, is provided with a structure of having a metallic conductive layer inserted in a single layer or in multiple layers into the in-between of the flexible material layer, e.g., polyamide. A driving integrated circuit is installed, which applies a driving signal to a thin film transistor.

A chip 27 is installed at a central portion of the flexible printed circuit board 26. A printed circuit board 28 is mounted at an end portion of the flexible printed circuit board 26.

The reinforcing member 90 is disposed in between the display panel 20a and the rear cover 85. The rear surface of the reinforcing member 90 is adhesively coupled to the rear cover 85. The front surface of the reinforcing member 90 is adhesively coupled to the display panel 20a.

In the embodiment, the reinforcing member 90, the rear cover 85, and the display panel 20a are coupled by using adhesive member, e.g., a double-sided tape.

The reinforcing member 90 penetrates the main frame 40a. The reinforcing member 90 is coupled to the rear surface of the display panel 20a and to the front surface of the rear cover 85.

The reinforcing member 90 is provided with a predetermined thickness. The reinforcing member 90 is configured to couple the display panel 20a to the rear cover 85, while the display panel 20a and the rear cover 85 are spaced apart. A driving unit 25, connected to the display panel 20a, is positioned at the space, formed as the rear cover 85 and the display panel 20a are spaced apart.

The driving unit 25 includes the flexible printed circuit board 26, a driving chip 27 installed at a central portion of the flexible printed circuit board 26, and a circuit board 28 connected to end portion of the flexible printed circuit board 26.

Figure 3:
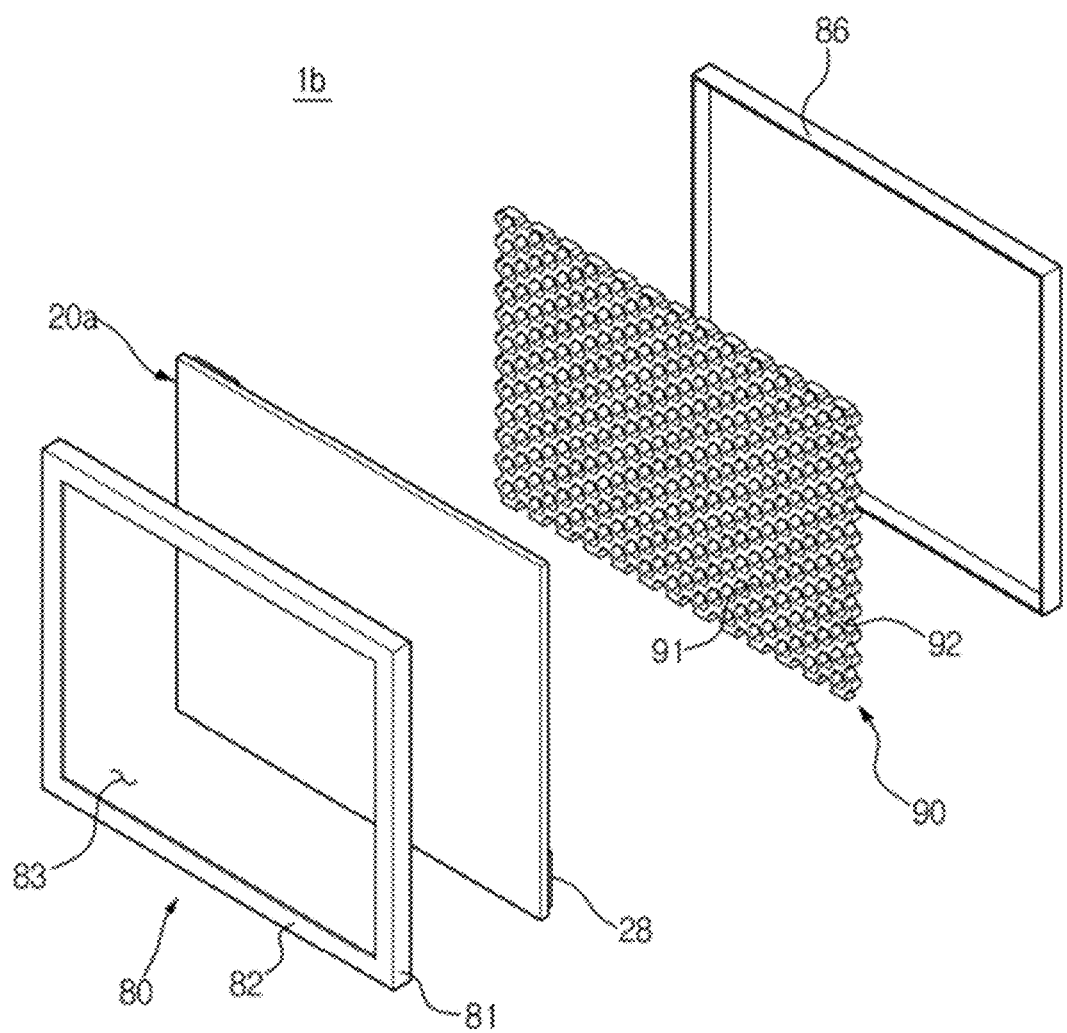
FIG. 3 is a perspective view illustrating a structure of a display device in accordance with the second embodiment of the present disclosure.

FIG. 3 is a perspective view illustrating a structure of a display device in accordance with the second embodiment of the present disclosure.

As illustrated in FIG. 1, the description will be provided on the basis of the difference from the first embodiment.

As illustrated in FIG. 3, a display device 1b includes the display panel 20a, a rear cover 86 forming the rear exterior appearance of the display device 1b, the reinforcing member 90 disposed in between the rear cover 86 and the display panel 20a to increase the strength of the display device 1b, and a front cover 80 disposed at the front surface of the display panel 20a and forms the external appearance of the front of the display device 1b while coupled to the rear cover 86.

The front cover 80 includes a bezel 82, wrapping around the edge of the display panel 20a, to cover the pattern of the display panel 20a, and a side surface 81 formed at one end of the bezel 82, and bent toward a rear direction. The front surface of the front cover 80 is provided with an opening unit 83 format such that the valid area, at which the screen is displayed on the display panel 20a, is exposed toward a front surface.

The rear cover 80 is coupled to the rear cover 86, and forms an exterior appearance of the entire display device 1b.

The display panel 20a and the reinforcing member 90 are disposed in between the front cover 80 and the rear cover 86.

The reinforcing member 90 includes a body unit 92 and a plurality of cells, penetratively formed at the body unit 92. Particularly, the reinforcing member 90 is formed in the honeycomb structure having a hexagonal shape of the cell. Thus, the reinforcing member 90 is light and has high strength.

The display device 1b is formed, as the front cover 80, the display panel 20a, the reinforcing member 90, and the rear cover 86 are accumulated and coupled, in the above described order.

In the embodiment, to achieve the honeycomb structure, the cell 91 is formed in a hexagonal shape. However, the cell 91 may be formed in a circular shape or in a polygonal shape, included in the present disclosure.

Figure 4:
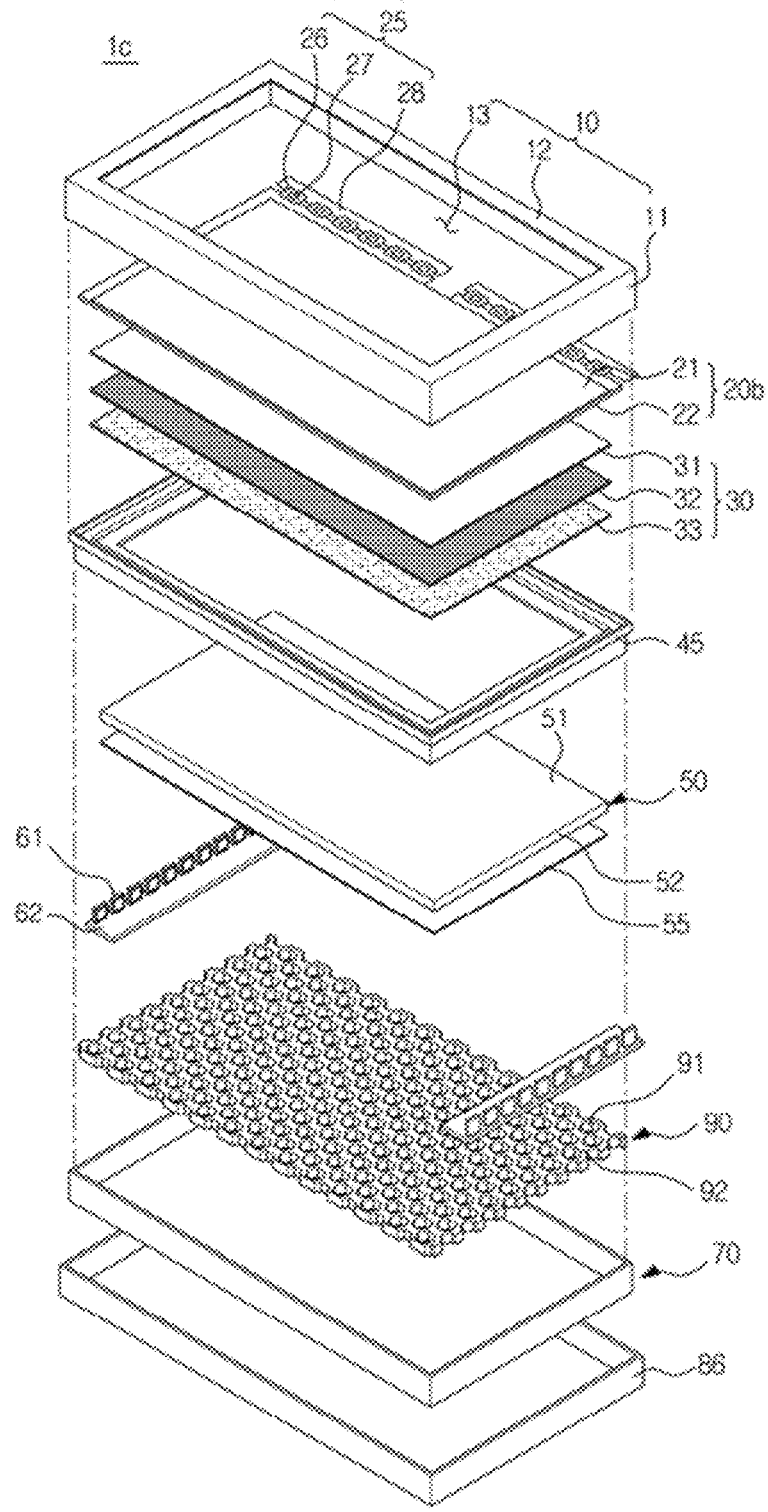
FIG. 4 is a perspective view illustrating a structure of a display device in accordance with the third embodiment of the present disclosure.
Figure 5:
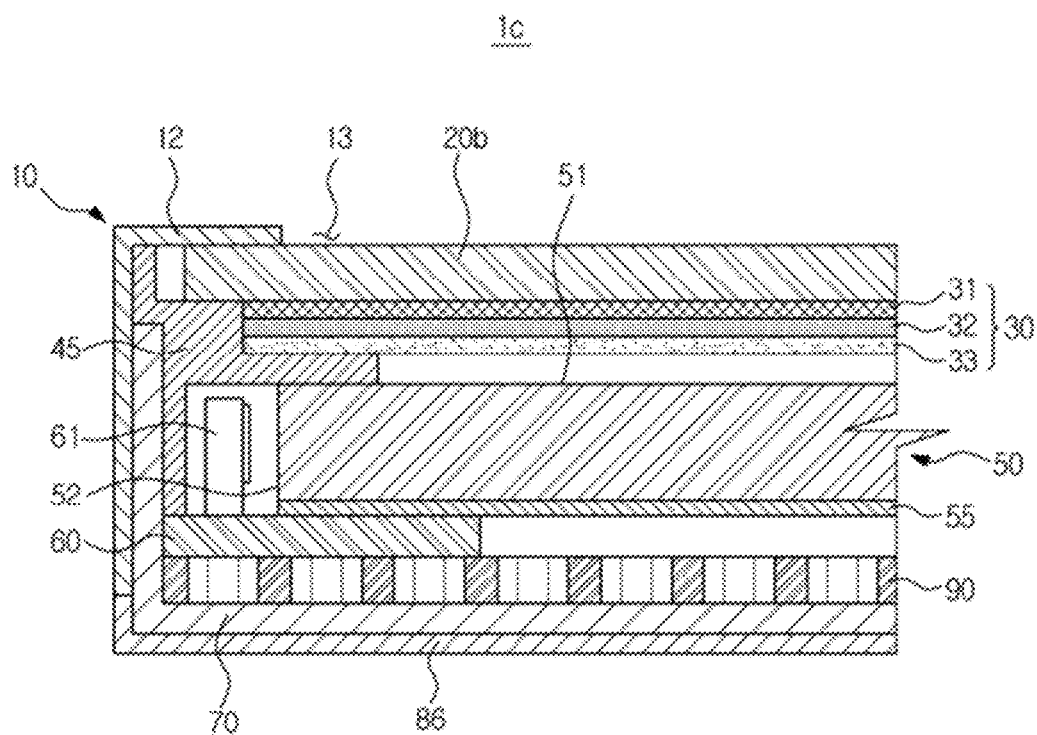
FIG. 5 is a cross-sectional view of the display device of FIG. 4.

FIG. 4 is a perspective view, illustrating a structure of a display device in accordance with the third embodiment of the present disclosure. FIG. 5 is a cross-sectional view of the display device of FIG. 4.

FIG. 4, is different from the previous drawings in that the structure is illustrated vertically. Thus, the upper portion of the drawing represents the front of a display device 1c, and the lower portion of the drawing represents the rear of the display device 1c.

As illustrated in FIGS. 4 to 5, the display device 1c includes a display panel 20b, a backlight unit disposed at a rear of the display panel 20b, a middle mold 45 configured to support a display panel 10 and the backlight unit to be spaced start to each other, a top sash 10 disposed at the front surface of the display panel 20b, a bottom sash 70 disposed at the rear of the display panel 20b, the reinforcing member 90 configured to increase the strength of the entire bottom sash 70 and the display device 1c, and the rear cover 85 disposed at the rear of the bottom sash 70 to form the exterior appearance of the rear of the display device 1c.

In the embodiment, since a separate backlight unit is included, the display panel 20b is referred to as a light receiving type liquid crystal display (LCD).

A display module is formed, as the coupling is made from the top sash 10 to the bottom sash 70, and as the rear cover 85 is coupled to the display module, the display device 1c. Depending on the embodiment, a front surface cover (not shown), which is not illustrated in the drawings, is coupled to the front of the top sash 10 to form the exterior appearance of the front of the display device 1c.

The backlight unit includes a plurality of optical sheets 30 disposed at a lower portion of the display panel 20b, a light board 50 positioned at a lower portion of the optical sheet 30, a reflection sheet 55 disposed while making contact with a lower surface of the light board 50, a plurality of light emitting diodes 61 configured to supply light to the light board 50, and a printed circuit board 62 at which the plurality of light emitting diodes 61 is installed.

The optical sheet 30 includes a protective film 31, a prism film 32, and a diffusing filter 33.

The protective film 31 is disposed at an upper portion of the prism film 32. The protective film 31 protects the prism film 32. The prism film 32 is sensitive to a scratch, e.g., dust.

In order to collect the light, the prism film 32 is diffused from the diffusing film 33, on the flat surface of the display panel 10 of an upper portion.

A prism, having a shape of a triangular column, is formed while arranged in a certain layout at an upper portion surface of the prism film 32 to collect the light diffused from the diffusing film 33 in a perpendicular direction on the flat surface of the display panel 20b of an upper portion.

The prism film 32 is used in two sheets. A micro prism formed at each of the prism film 32 forms a predetermined angle.

The light passed through the prism film 32 is processed in a perpendicular manner. Therefore, the light provides an even phase dispersion.

A coating layer, having a shape of a bead, is formed on a base panel of the diffusing film 33 to diffuse light from the light board 50. Thus, the light is supplied to the display panel 10.

The light board 50 is composed of acrylic type resin, e.g., polymethyl methacrylate (PMMA) or polymethylstrene. The light board 50 evenly supplies the light radiated from the light emitting diode to the diffusing film 33.

The light board 50 includes an incidence surface 52, provided at one end of a side to receive the light radiated from the light emitting diode 61, a light emitting surface 51 facing the diffusing film 33, and a reflection surface (not shown) provided in parallel to the light emitting surface 51.

A reflection sheet 55 is disposed at a lower portion of the light board 50 to guide the light. The light, which is emitted through the lower surface of the light board 50, is guided again to the light board 50. The reflection sheet 55 may be made with plastic material, e.g., polyethylene terephthalate (PET) or polycarbonate (PC).

The plurality of light emitting diodes 61, configured to radiate light, is installed at the printed circuit board 62. The printed circuit board 62 applies an electrical signal to the plurality of light emitting diodes 61.

In the embodiment, two printed circuit boards 62 are provided at the edge of the left side and the right side of the bottom sash 70.

The plurality of light emitting diodes is installed at one surface of the printed circuit board 62 in a protruded direction toward a front of the printed circuit board. Each one of the plurality of light emitting diodes 61 is lengthwise disposed in the printed circuit board 62, while spaced apart from each other. The plurality of light emitting diodes 61 radiates light in a perpendicular direction, to the direction being protruded from the printed circuit board 62.

The back surface of the printed circuit board 62, at which the plurality of light emitting diodes 61 is installed, is disposed in a direction toward the bottom of the bottom sash 70.

The light emitting diode 61 may be composed of the plurality of light emitting diodes, which radiate white light. The light emitting diode may also be composed of the plurality of light emitting diodes, which radiate red light, green light, and blue light.

The display panel 20b includes a thin film transistor printed circuit board 21, in which the thin film transistor is formed, a color filter board 22 facing the thin film transistor printed circuit board 21, and a liquid layer (not shown) provided in between the thin film transistor printed circuit board 21 and the color filter board 22.

The driving unit 25 is provided at one side of the thin film transistor printed circuit board 21, and applies a driving signal.

The driving unit 25 includes the flexible printed circuit board 26, the driving ship 27 installed at the flexible printed circuit board 26, and the printed circuit board 28 connected to the other side of the flexible printed circuit board 26.

The flexible printed circuit board 26 shows the method of the Chip-on-Film (COF) of which a chip device is mounted on a base film. The COF may be in the form of a Tape Carrier Package (TCP) using Tape Automated Bonding (TAP) technology, or a Chip-on-Glass (COG).

The display panel 20b, in accordance with the embodiment, is a liquid display panel configured to form a screen by controlling the arrangement of the liquid layer. Since the display panel 20b is a device that does not emit light, an image may be displayed only by receiving light from the backlight unit positioned at the back surface of the display device 20a.

The top sash 10 includes the bezel 12 wrapping around the edge of the display panel 20b, and a side surface of the top that is bent at end portion of the bezel 12. The front surface of the top sash 10 is provided with an opening unit 13 so that the valid area on which a screen displayed is exposed to the front surface.

The reinforcing member 90 is mounted at the front surface of the bottom of the bottom sash 70.

The reinforcing member 90 includes the body unit 92, and the plurality of cells 91 penetratively formed on the body unit 92.

The cell 91 is formed in a hexagonal shape. Therefore, the reinforcing member 90 forms the honeycomb structure or the beehive structure.

The reinforcing member 90 is formed in the honeycomb structure. Thus, the reinforcing member 90 can be light and strong.

When the reinforcing member 90 is mounted at the bottom sash 70, even though the bottom sash 70 is manufactured in a shape of a flat surface, the strength of the bottom sash 70 is unaffected.

Furthermore, the weight of the reinforcing member 90 having the honeycomb structure is not great. Thus, the weight of the entire display device 1c is not largely increased.

When the body unit 92, of the reinforcing member 90, is formed with the material having high heat conductivity, the heat being generated from the main board (not shown) mounted at the bottom sash 70 or from the power supply board (not shown) may be able to be dispersed entirely through the display panel 1c.

The body unit 92 may be formed with aluminum or plastic. However, the body unit 92 may be formed with various materials to achieve the objective of the present disclosure.

In the embodiment, to achieve the honeycomb structure, the cell 91 is formed in hexagonal shape. The cell 91, formed in a circular shape or in a polygonal shape, may be included in the present disclosure.

The reinforcing member 90, the backlight unit having the printed circuit board 62, the middle mold 44, the optical sheet 30, and the display panel 20b are settled and disposed at the bottom sash 70 in the above described order. When the top sash 10 is coupled to the front of the bottom sash 70, a single display module is formed.

When the rear cover 86 is coupled to the display module, the display device 1c is completed.

In the embodiment, the display device 1c is illustrated having the top sash 10 as the front surface cover. The front surface cover is coupled to the front of the top sash 10, and may be included in an aspect of the present disclosure.

Figure 6:
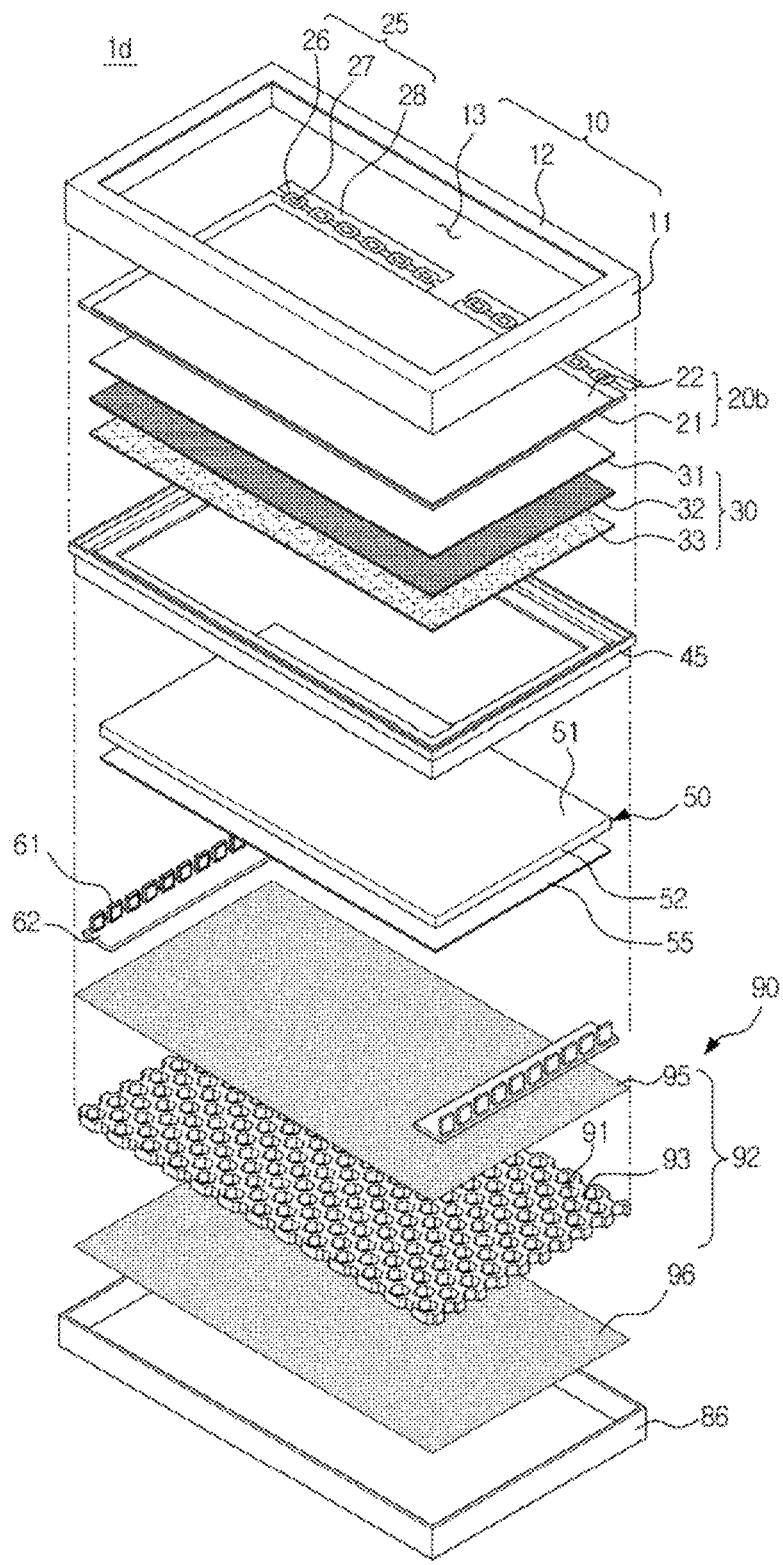
FIG. 6 is a perspective view illustrating a structure of a display device in accordance with the fourth embodiment of the present disclosure.
Figure 7:
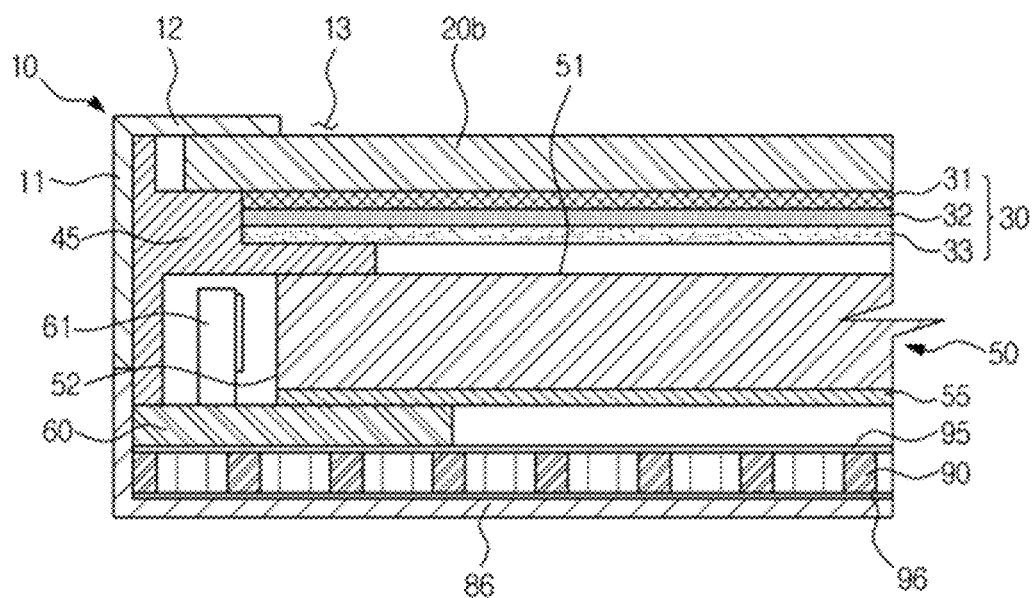
FIG. 7 is a cross-sectional view of the display device of FIG. 6.

FIG. 6 is a perspective view illustrating a structure of a display device in accordance with the fourth embodiment of the present disclosure. FIG. 7 is a cross-sectional view of the display device of FIG. 6.

As illustrated in FIGS. 6 to 7, a display device 1d includes the display panel 20b, a backlight unit disposed at a rear of the display panel 20b while spaced apart from the display panel 20b, a middle mold 45 configured to support a display panel 10 and the backlight unit to be spaced start to each other, a top sash 10 disposed at the front surface of the display panel 20b, the reinforcing member 90 disposed at the rear of the display panel 20b, the reinforcing member 90 configured to increase the strength of the entire bottom sash 70 and the display device 1c, and the rear cover 85 disposed at the rear of the reinforcing member 90 to form the exterior appearance of the rear of the display device 1d.

In the embodiment, the bottom sash itself is formed with the reinforcing member 90. The bottom sash 90 is formed in the honeycomb structure.

Although not shown on the drawings, the reinforcing member 90 may be provided to be disposed at a rear of the rear cover 85

The backlight unit having the printed circuit board 60, is mounted at the reinforcing member 90 formed in the honeycomb structure.

In order to facilitate the coupling of the printed circuit board 60 mounted on the reinforcing member 90 in the honeycomb structure, and other parts, the reinforcing member 90 may have the plates 95 and 96 coupled to a front surface and a rear surface thereof, respectively. In this case, the body unit 92 includes the two plates 95 and 96, and the support 93 disposed between the two plates 95 and 96, and the plurality of cells 91 penetratively is formed through the body unit 92.

In the above case where the body unit 92 includes the two plates 95 and 96, and the support 93, the body unit 92 may be referred to as a plate-like assembly.

Although each of the two plates 95 and 96 and the support 93 is illustrated as an integral unit on the drawings, the present disclosure is not limited thereto. For example, each of the two plates 95 and 96 and the support 93 may be provided as a plurality of subdivided units, so as to be coupled to one another. In the case where each of the two plates 95 and 96 and the support 93 is provided as a plurality of subdivided units, some of the plurality of subdivided units may be coupled to the rear cover 85.

In the embodiment, the total of two plates 95 and 96 are coupled. A plate mounted at the front surface of the reinforcing member 90 is included in an aspect of the present disclosure.

The plates 95 and 96 may be provided in a form of sheets. As an example of a sheet, an aluminum sheet or a non-woven fabric is provided. However, embodiments are not limited thereto.

Figure 8:
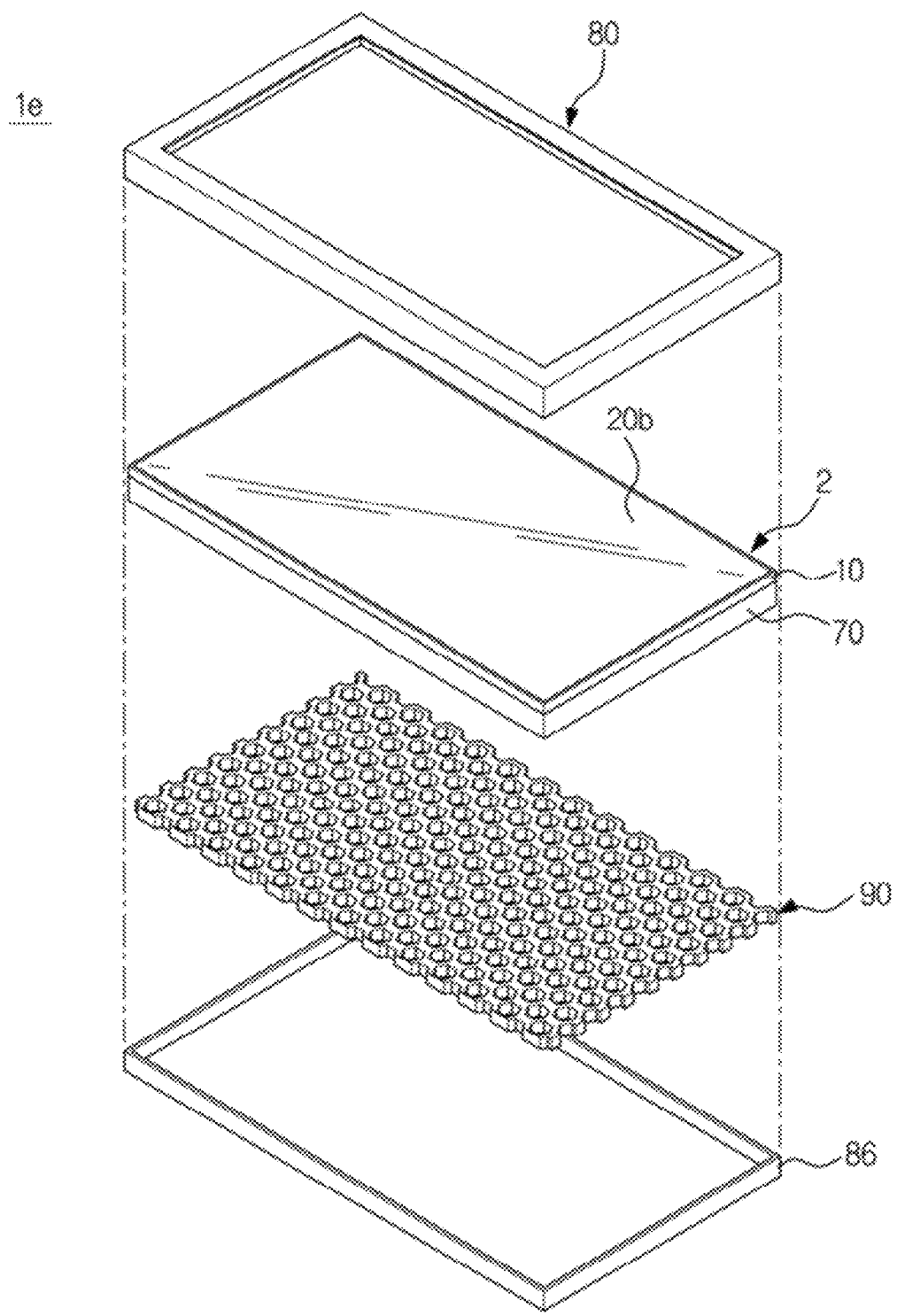
FIG. 8 is a perspective view illustrating a structure of a display device in accordance with the fifth embodiment of the present disclosure.

FIG. 8 is a perspective view illustrating a structure of a display device, in accordance with the fifth embodiment of the present disclosure.

As illustrated in FIG. 8, a display device 1e includes a display module 2 formed as the top sash 10 and the bottom sash 70 are coupled, the front cover 80 disposed at the front surface of the display module 2, the reinforcing member 90 disposed at the rear of the display module 2, and the rear cover 86 disposed at the rear of the reinforcing member 90 and forms the exterior appearance of the display device 1e by coupling to the front cover 80.

The display module 2 forms the exterior appearance as the top sash 10 and the bottom sash 70 are coupled, and is formed as the display panel 20b is exposed to the front surface of the top sash 10.

The backlight unit (not shown) is mounted inside the display module 2 to supply light to the display panel 20b.

The reinforcing member 90 is adhesively coupled to the rear surface of the display module 2.

As the reinforcing member 90 is formed in the honeycomb structure, the reinforcing member 90 is light and has high strength. Thus, the weight of the entire display device 1e is not increased by a great amount.

In addition, the heat radiation performance of the display device 1e may be improved by the reinforcing member 90.

The rear cover 86 is disposed at the rear surface of the reinforcing member 90. As the rear cover 86 and the front surface cover 80 are coupled, the display device 1e is formed.

Although a few embodiments of the present disclosure have been shown and described, it would be appreciated by those skilled in the art that changes may be made in these embodiments without departing from the principles and spirit of the disclosure, the scope of which is defined in the claims and their equivalents.

What is claimed is:

1. A display device configured to display an image, the display device comprising:
    a display panel having an active area and an inactive area;
    a cover disposed at a rear side of the display panel to support the display panel;
    a protecting member disposed at a front side of the display panel to protect a front surface of the display panel, the protecting member including an inner portion and an edge portion surrounding the inner portion; and
    a black matrix formed on only the edge portion of the protecting member corresponding to the inactive area of the display panel among the inner portion and the edge portion of the protecting member.

2. The display device of claim 1, wherein the black matrix covers a pattern formed at the inactive area, and
    wherein the pattern is at least one of an integrated circuit and a wiring pattern is formed on the inactive area.

3. The display device of claim 1, wherein the black matrix is printed on the edge portion of the protecting member.

4. The display device of claim 1, wherein the protecting member includes a PVA (poly-vinyl alcohol) layer to polarize a penetrated light, a TAC (tri-acetyl cellulose) layer to protect the PVA layer provided at an upper side of the PVA layer, and a COP (cyclo-olefin polymer) layer forming a substrate layer of the protecting member, and
    wherein the TAC layer is formed with tri-acetyl cellulose (TAC) having a phase value of about '0'.

5. The display device of claim 1, further comprising a frame having an edging portion that surrounds a periphery of the display panel and a settling portion that is extended from the edging portion to be disposed between the display panel and the cover.

6. The display device of claim 5, wherein the settling portion comprises a flat plate-shaped protrusion extending from the edging portion.

7. The display device of claim 5, further comprising a reinforcing member disposed between the display panel and the cover.

8. The display device of claim 7, wherein at least one part of the settling portion contacts at least one part of the display panel and the other part of the settling portion contacts at least one part of the reinforcing member.

9. The display device of claim 8, wherein the settling portion, the display panel and the reinforcing member each other by an adhesive member.

10. The display device of claim 7, wherein the display panel is on one surface of the settling portion and the reinforcing member is on an opposed second surface of the settling portion.

11. The display device of claim 5, wherein the display panel contacts with a side of the settling portion, and the cover contacts with an other side of the settling portion.

12. The display device of claim 5, wherein an inner portion of the edging portion includes a first portion in contact with the display panel and a second portion in contact with the cover, and the settling portion extends from between the first portion and the second portion.

13. The display device of claim 12, wherein the first portion of the edging portion and the second portion of the edging portion are integrally formed.

14. The display device of claim 1, further comprising a driving unit having a printed circuit board that is electrically connected to the display panel and is positioned between the cover and the display panel.

15. The display device of claim 5, wherein the frame has a T-shaped cross section, wherein a length of the settling portion is larger than a width of the edging portion.

16. The display device of claim 1, wherein the cover covers at least a portion of the rear side of the display panel.

17. The display device of claim 1, wherein the cover covers an entire rear portion of the display panel.

* * * * *